(12) United States Patent
Falcou et al.

(10) Patent No.: US 7,767,785 B2
(45) Date of Patent: Aug. 3, 2010

(54) CONJUGATED POLYMERS, THEIR PREPARATION AND USE THEREOF

(75) Inventors: Aurélie Falcou, Frankfurt (DE); Frank Meyer, Heidelberg (DE); Amir Parham, Frankfurt (DE); Heinrich Becker, Hofheim (DE)

(73) Assignee: Merck Patent GmbH (DE)

( * ) Notice: Subject to any disclaimer, the term of this patent is extended or adjusted under 35 U.S.C. 154(b) by 1025 days.

(21) Appl. No.: 10/572,074

(22) PCT Filed: Sep. 18, 2004

(86) PCT No.: PCT/EP2004/010505
§ 371 (c)(1),
(2), (4) Date: Aug. 9, 2006

(87) PCT Pub. No.: WO2005/030828
PCT Pub. Date: Apr. 7, 2005

(65) Prior Publication Data
US 2009/0014690 A1    Jan. 15, 2009

(30) Foreign Application Priority Data
Sep. 20, 2003 (DE) ............... 103 43 606
Dec. 5, 2003 (DE) ............... 103 57 317

(51) Int. Cl.
*C08G 73/06* (2006.01)
*C08G 61/00* (2006.01)
*C08G 75/06* (2006.01)
*H01B 1/12* (2006.01)
*H01L 51/05* (2006.01)
*H01L 51/30* (2006.01)

(52) U.S. Cl. ............... 528/423; 528/86; 528/380; 525/375; 525/376; 525/535; 525/540; 252/500

(58) Field of Classification Search ............... 528/423, 528/86, 380; 252/500; 525/375, 376, 535, 525/540
See application file for complete search history.

(56) References Cited

U.S. PATENT DOCUMENTS

| 6,956,095 B2 | 10/2005 | Treacher et al. |
| 2004/0135131 A1 | 7/2004 | Treacher et al. |
| 2004/0206939 A1 | 10/2004 | Spreitzer et al. |
| 2005/0038223 A1 | 2/2005 | Becker et al. |

FOREIGN PATENT DOCUMENTS

| DE | 103 37 077 | 3/2005 |
| DE | 103 37 346 | 3/2005 |
| EP | 0 423 283 | 4/1991 |
| EP | 1 078 970 | 2/2001 |
| WO | WO-00/46321 | 8/2000 |
| WO | WO-02/072714 | 9/2002 |
| WO | WO-02/077060 | 10/2002 |
| WO | WO-03/019694 | 3/2003 |
| WO | WO-03/020790 | 3/2003 |
| WO | WO-03/048225 | 6/2003 |
| WO | WO-2004/037887 | 5/2004 |

*Primary Examiner*—Duc Truong
(74) *Attorney, Agent, or Firm*—Connolly Bove Lodge & Hutz LLP

(57) ABSTRACT

The present invention relates to conjugated polymers which comprise both structural units of the formula (1) and also structural units of the formula (2). The materials according to the invention are more readily soluble, display improved air stability and display a smaller voltage increase during prolonged operation when used in a polymeric organic light-emitting diode (PLED) than polymers according to the prior art.

20 Claims, 1 Drawing Sheet

Voltage as a function of time at constant current density

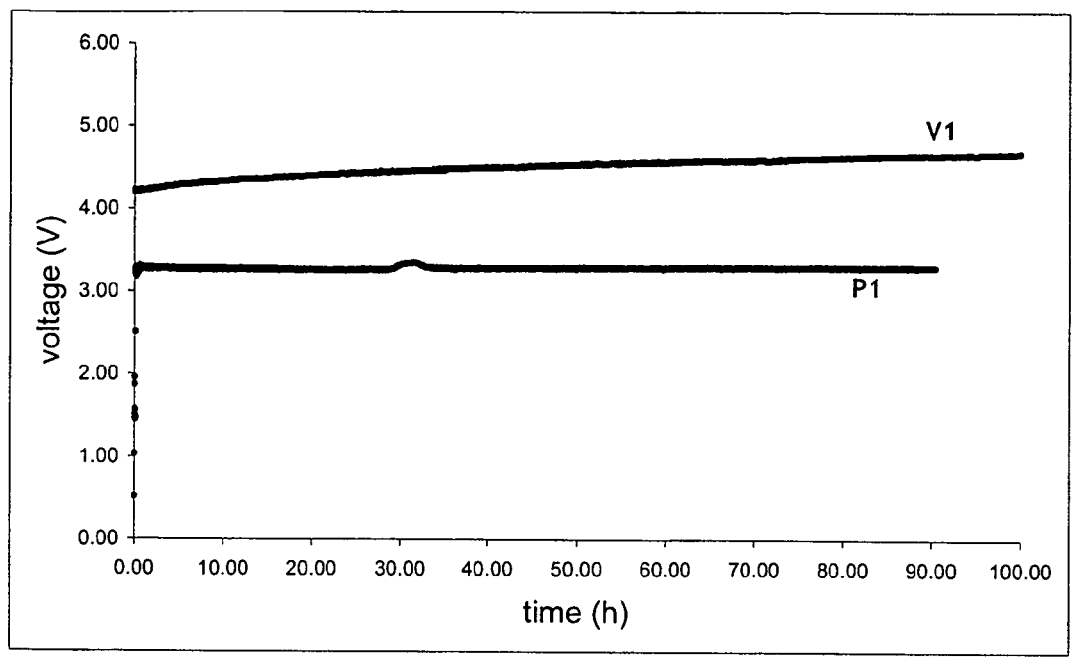
Figure 1: Voltage as a function of time at constant current density

CONJUGATED POLYMERS, THEIR PREPARATION AND USE THEREOF

RELATED APPLICATIONS

This application is a national stage application (under 35 U.S.C. 371) of PCT/EP2004/010505 filed Sep. 18, 2004 which claims benefit to German application 103 43 606.5 filed Sep. 20, 2003 and German application 103 57 317.8 filed Dec. 5, 2003.

Wide-ranging research on the commercialization of display and lighting elements based on polymeric (organic) light-emitting diodes (PLEDs) has been carried for about 12 years. This development was started by the fundamental developments disclosed in EP 423283. Recently, a first albeit simple product (a small display in a shaver from PHILIPS N.V.) has also been available on the market. However, significant improvements of the materials used are still necessary to make these displays genuinely competitive with the liquid crystal displays (LCDs) which currently dominate the market or to surpass these.

To produce all three emission colors, it is necessary to incorporate particular comonomers into the appropriate polymers (cf., for example, WO 00/46321, WO 03/020790 and WO 02/077060). In this way, it is then generally possible, starting from a blue-emitting base polymer ("backbone"), to produce the other two primary colors red and green.

Some of the conjugated polymers of the prior art display good properties when used in PLEDs. However, despite the progress achieved, they still do not meet the requirements needed for unproblematical processing and for demanding applications. Thus, the stability of many polymers of the prior art toward oxygen and/or other constituents of air is not at all satisfactory, i.e. the polymers display significantly poorer properties in PLEDs after contact with air. As a consequence, the efficiency and the life of the polymers are reduced drastically. This makes processing of the polymers and production of the PLEDs under inert conditions necessary, which is a considerable additional complication and thus a technological disadvantage. It would be desirable to have polymers available which are stable toward air but whose properties in the device are equally good or better than those of the polymers of the prior art. It is also necessary to develop polymers whose operating voltage when used in OLEDs can be reduced. This is necessary to increase the power efficiency of the OLEDs.

It has now surprisingly been found that a new class of polymers which firstly have a particular polymer backbone and secondly contain particular substituted dithienylarylene units display very good properties which surpass the above-mentioned prior art. In particular, these polymers are largely inert toward air. Furthermore, they display a good efficiency and life when used in PLEDs and are readily soluble in a large number of organic solvents. In particular, the operating voltage of the polymers is also lower compared to polymers of the prior art, as is the increase in voltage on prolonged operation. These polymers and their use in PLEDs are therefore subject matter of the present invention.

The use of unsubstituted and substituted dithienylarylene units in conjugated polymers for electroluminescence has already been described in the literature. However, these publications relate mainly to homopolymers of these units (e.g. J. Pei et al., *Macromolecules* 2000, 33, 2462; J. Pei et al., *Macromolecules* 2001, 34, 7241). The photoluminescence quantum yield was able to be increased compared to pure polythiophenes by introduction of the arylene units. That these polymers are nevertheless not suitable for electroluminescence is shown by the PLED results obtained using these polymers: the cutoff voltages are greater than 8 V, depending on the polymer and device configuration even up to 20 V, and the external quantum efficiencies are in the range from 0.05 to 0.6%, sometimes even much lower. Both the voltages and the quantum efficiencies are thus significantly behind the state of the art and it is obvious that the higher PL quantum yield does not contribute to satisfactory EL efficiencies. These polymers are thus unsuitable for commercial use in PLEDs.

Copolymers of this unit with phenylene units are also known. Alternating thienylene-phenylene polymers (e.g. J. M. Xu et al., *Macromolecules* 2001, 34, 4314) are obtained in this way. Results for these polymers in electroluminescence are not reported; but it can be deduced from the description that these polymers are not suitable for electroluminescence. Thus, it is stated for some derivatives that they display strong interaction of the polymer chains, which results in a shift in the fluorescence wavelength. Such emission bands frequently display a very low efficiency. In addition, these polymers could only be prepared with a low molecular weight, which is unacceptable for industrial use, e.g. processing by means of printing techniques. Furthermore, the polymers have only a very poor solubility in solvents such as toluene or xylene which are customarily used for processing of the polymers from solution. The production of PLEDs using these polymers will therefore be associated with considerable difficulties or be possible only in poor quality.

Copolymers of unsubstituted dithienylphenylene or dithienylanthrylene units with spirobifluorenes and further comonomers are given as examples in WO 03/020790. Particular advantages of these units are not given. However, polymers containing these units suffer from problems in synthesis and processing as a result of the poor solubility of the oligomers and polymers. Thus, the synthesis can frequently not be carried out in homogeneous solution, the work-up is made more difficult, as is the preparation of solutions of these polymers, and homogeneous films of the polymers are not obtained when they are used in PLEDs. This is the case particularly when a relatively high proportion of these monomers is copolymerized into the polymers, as would be desirable for the electrooptical properties of the polymer (color, efficiency, life). Processing of these polymers by means of printing techniques, e.g. ink jet printing, is thus possible only with difficulty, if at all. It is not clear from this patent application how readily soluble polymers having good electrooptical properties could be developed using these units.

The invention provides polymers comprising at least 5 mol %, preferably at least 10 mol %, particularly preferably at least 40 mol %, of units of the formula (1), Formula (1)

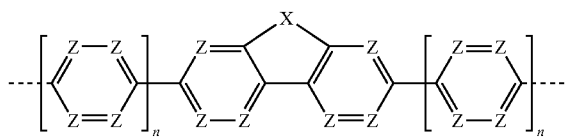

where the symbols used have the following meanings:
X is identical or different on each occurrence and is in each case $CR_2$, $N(R^1)$, $-CR_2-CR_2-$ or $-N(R^1)-CR_2-$;
Z is identical or different on each occurrence and is in each case CR or N;
R is identical or different on each occurrence and is in each case H, a linear, branched or cyclic alkyl or alkoxy chain which has from 1 to 22 carbon atoms and in which one or more nonadjacent carbon atoms may also be replaced by —N(R$^1$)—, —O—, —S—, —O—CO—O—, —CO—O—, C=O, —C(R$^1$)=C(R$^1$)— or —C≡C—, where one or more H atoms may also be replaced by fluorine or an aromatic group R$^1$, an aromatic or heteroaromatic ring system or an aryloxy group having from 5 to 40 carbon atoms, in which one or more carbon atoms may also be replaced by O, S or N and which may also be substituted by one or more nonaromatic radicals R, where two or more of the radicals R may together also form an aromatic or aliphatic, monocyclic or polycyclic ring system, or fluorine, chlorine, CN, N(R$^1$)$_2$, Si(R$^1$)$_3$ or B(R$^1$)$_2$;

R$^1$ is identical or different on each occurrence and is in each case H, a linear, branched or cyclic alkyl chain which has from 1 to 22 carbon atoms and in which one or more nonadjacent carbon atoms may also be replaced by —O—, —S—, —CO—O—, —O—CO—O—, C=O, —CH=CH— or —C≡C—, where one or more H atoms may also be replaced by fluorine, an aryl, heteroaryl or aryloxy group which has from 5 to 40 carbon atoms and in which one or more carbon atoms may also be replaced by O, S or N, which may also be substituted by one or more nonaromatic radicals R$^1$, where one or more radicals R$^1$ or R$^1$ and further radicals R may together also form an aromatic or aliphatic, monocyclic or polycyclic ring system;

n is identical or different on each occurrence and is in each case 0 or 1;

characterized in that the polymer further comprises at least 0.01 mol %, preferably at least 1 mol %, particularly preferably at least 5 mol %, very particularly preferably at least 10 mol %, of units of the formula (2),

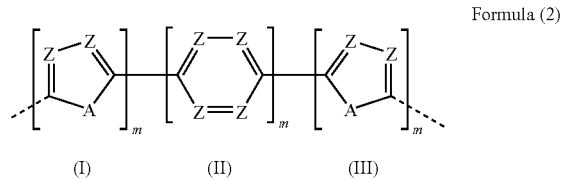

Formula (2)

where the symbols and indices have the following meanings:

A is identical or different on each occurrence and is in each case S, O or N(R$^1$);

Z is identical or different on each occurrence and is in each case CR or N, with the proviso that the central unit (II) is not a quinoxaline, not a benzothiadiazole and not an unsubstituted anthracene and with the further proviso that at least one radical R is not hydrogen;

m is identical or different on each occurrence and is in each case 1, 2 or 3;

the further symbols are as described under the formula (1);

and the broken-line bond in formula (1) and formula (2) as in all further formulae indicates the linkage in the polymer; it should in this case not be a methyl group.

Even if this is indicated in the description, it may here be explicitly mentioned that the structural units of the formula (1) and formula (2) can also be unsymmetrically substituted, i.e. different substituents R or R$^1$ can be present on one substituent. In addition, various units of the formula (1) and/or the formula (2) can be present in a polymer. It should likewise once again be explicitly mentioned that the radicals R can together form a ring system. This applies particularly to the radicals R on the position X, so that, for example, spirosystems, in particular spirobifluorene, are expressly included. Likewise, more extended bridged systems formed in this way, for example cis- or trans-indenofluorenes or related structures, are also possible.

BRIEF DESCRIPTION OF THE FIGURE

FIG. 1 shows the changes in operating voltage over time.

The polymers of the invention can be conjugated, partially conjugated or nonconjugated. In a preferred embodiment of the invention, the polymers are conjugated or partially conjugated; in a particularly preferred embodiment, the polymers are conjugated.

For the purposes of the present invention, conjugated polymers are polymers which have mainly sp$^2$-hybridized (or sp-hybridized) carbon atoms, which may also be replaced by appropriate heteroatoms, in the main chain. In the simplest case, this means the alternating presence of double and single bonds in the main chain. "Mainly" means that naturally (accidentally) occurring defects which lead to interruptions in the conjugation do not invalidate the term "conjugated polymer". Furthermore, polymers are likewise referred to as conjugated in the present patent application text when, for example, arylamine units and/or particular heterocycles (i.e. conjugation via N, O or S atoms) and/or organic metal complexes (i.e. conjugation via the metal atom) are present in the main chain. On the other hand, units such as simple (thio)ether bridges, alkylene bridges, ester, amide or imide linkages would clearly be defined as nonconjugated segments. For the purposes of the present invention, partially conjugated polymers are polymers in which relatively long conjugated sections in the main chain are interrupted by nonconjugated sections, or polymers which have relatively long conjugated units in the side chains of a polymer which is not conjugated in the main chain.

The polymers of the invention can comprise further structural elements in the addition to units of the formulae (1) and (2). These are, inter alia, units which have been disclosed in the patent applications WO 02/077060 and DE 10337346.2. The further structural units can, for example, come from the classes described below:

Group 1: units which significantly improve the hole injection properties and/or hole transport properties of the polymers;
Group 2: units which significantly improve the electron injection properties and/or electron transport properties of the polymers;
Group 3: units which comprise combinations of individual units of group 1 and group 2;
Group 4: units which influence the morphology or possibly also the emission color of the polymers.

Structural elements of group 1, which have hole transport properties, are generally arylamine derivatives or electron-rich heterocycles, for example triarylamine derivatives, benzidine derivatives, tetraarylene-para-phenylenediamine derivatives, phenothiazine derivatives, phenoxazine derivatives, dihydrophenazine derivatives, thianthrene derivatives, dibenzo-p-dioxin derivatives, phenoxathiin derivatives, carbazole derivatives, azulene derivatives, thiophene derivatives, pyrrole derivatives, furan derivatives and further O-, S- or N-containing heterocycles having a high HOMO (HOMO=highest occupied molecular orbital); these units preferably lead to a HOMO in the polymer of less than 5.8 eV (relative to vacuum level), particularly preferably less than 5.5 eV.

Structural elements of group 2, which have electron transport properties, are generally electron-deficient heterocycles, for example pyridine derivatives, pyrimidine derivatives, pyridazine derivatives, pyrazine derivatives, triazine derivatives, anthracene derivatives, oxadiazole derivatives, benzothiadiazole derivatives, quinoline derivatives, quinoxaline derivatives, phenazine derivatives and also triarylboranes and further O-, S- or N-containing heterocycles having a low LUMO (LUMO=lowest unoccupied molecular orbital); these units preferably lead to a LUMO in the polymer of greater than 2.7 eV (relative to vacuum level), particularly preferably greater than 3.0 eV.

It can likewise be preferred that the polymers of the invention comprise units of group 3 in which units which improve the hole transport properties and units which improve the electron transport properties, i.e. units of group 1 and group 2, are bound directly to one another. Such units in the polymer frequently lead to color shifts into the yellow or red.

It can also be possible for further structural elements which are summarized in group 4 to be present. These units can influence the morphology or possibly also the emission color of the polymers. These are units which have at least one further aromatic or other conjugated structure which does not come under the abovementioned groups. Preference is here given to aromatic, carbocyclic structures having from 6 to 40 carbon atoms or stilbene or bisstyrylarylene derivatives, each of which may be substituted by a $C_1$-$C_{40}$ organic radical or be unsubstituted. Particular preference is given to the incorporation of 1,4-phenylene derivatives, 1,4-naphthylene derivatives, 1,4- or 9,10-anthrylene derivatives, 1,6- or 2,7- or 4,9-pyrenylene derivatives, 3,9- or 3,10-perylenylene derivatives, 2,7- or 3,6-phenanthrenylene derivatives, 4,4'-biphenylylene derivatives, 4,4"-terphenylylene derivatives, 4,4'-bi-1,1'-naphthylylene derivatives, 5,7-dihydrodibenzooxepinylene derivatives, 4,4'-stilbenzylene derivatives or 4,4"-bisstyrylarylene derivatives.

Furthermore, it is likewise possible to incorporate metal complexes which can emit light from the singlet state or from the triplet state or can fulfill other functions.

It can likewise be preferred that more than one structural unit from one of the groups mentioned are simultaneously present or more than one structural unit of the formula (1) and/or formula (2) are simultaneously present.

The polymers of the invention generally have from 10 to 10 000, preferably from 20 to 5000, particularly preferably from 50 to 2000, repeater units.

The necessary solubility of the polymers is ensured, in particular, by the substituents R, both on units of the formulae (1) and (2) and on further units which may be present. If substituents $R^1$ are present, these contribute to the solubility.

To ensure sufficient solubility, preference is given to an average of at least 2 nonaromatic carbon atoms being present in the substituents per repeater unit. Preference is given to at least 4, particularly preferably at least 8, nonaromatic carbon atoms. Some of these carbon atoms may also be replaced by O or S. This can, however, mean that a certain proportion of repeater units, both of the formulae (1) and (2) and also of other structural types, bear no further nonaromatic substituents. However, to obtain good solubility of the polymer, it is necessary for the units of the formula (2) to bear at least one aromatic or preferably nonaromatic substituent.

In order not to adversely affect the morphology of the film, it is preferred that there are no long-chain substituents having more than 12 carbon atoms in a linear chain, preferably no substituents having more than 8 carbon atoms, particularly preferably none having more than 6 carbon atoms.

Nonaromatic carbon atoms are, as, for example, in the description of R or $R^1$ in the formulae (1) and (2), present in appropriate linear, branched or cyclic alkyl or alkoxy chains.

In a preferred embodiment of the invention, Z=CR and n=0 in structural units of the formula (1). Particularly preference is given to Z=CH and n=0. Preference is also given to the group X being $CR_2$ or $CR_2$—$CR_2$. These structural units are very particularly preferably selected from the group consisting of fluorenes of the formula (3), 9,9'-spirobifluorenes of the formula (4) which may be substituted by a $C_1$-$C_{40}$ organic radical or be unsubstituted or dihydrophenanthrenes of the formula (5):

Formula (3):

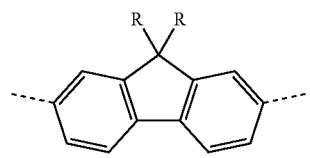

fluorene

Formula (4):

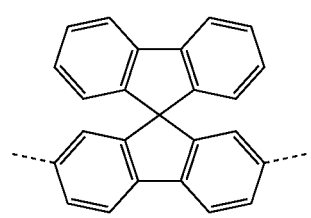

Spiro-9,9'-bifluorene

Formula (5):

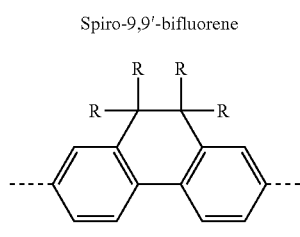

9,10-Dihydrophenanthrene

Preference is also given to extended structures in which at least one n is 1. Preferred structures are cis- or trans-indenofluorenes of the formulae (6) and (7):

Formula (6):

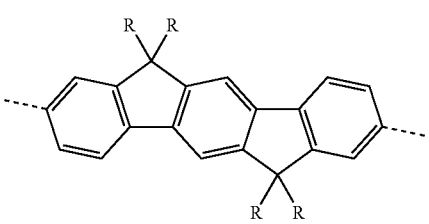

trans-indenofluorene

Formula (7):

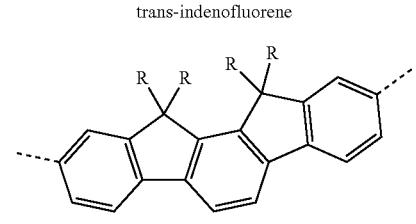

cis-indenofluorene

Here, the symbols R and $R^1$ used have the same meaning as described above under the formula (1).

It has been found that a proportion of at least 5 mol %, preferably a proportion of at least 10 mol %, particularly preferably a proportion of at least 40 mol %, of units of the formula (1) gives good results.

Preference is also given to polymers in which the following applies for units of the formula (2):

Z is identical or different on each occurrence and is in each case CR, with the abovementioned restrictions continuing to apply;

A is identical or different on each occurrence and is in each case O or S;

m is identical or different on each occurrence and is in each case 1 or 2;

and the further symbols are as defined above under the formula (2).

Furthermore, particular preference is given to polymers in which the following applies for units of the formula (2):

Z is identical or different on each occurrence and is in each case CR, with the abovementioned restrictions continuing to apply and at least two radicals R being different from hydrogen;

A is S on each occurrence;

R is as defined above under the formula (1);

$R^1$ is as defined above;

m is 1 on each occurrence.

It has been found that a proportion of at least 1 mol %, preferably at least 5 mol %, particularly preferably at least 10 mol %, of units of the formula (2) gives good results for green- or red-emitting polymers. However, in the case of white-emitting copolymers, for example as described in DE 10343606.5, a smaller proportion of these units, in particular in the range from 0.01 to 1 mol %, can give very good results.

The copolymers of the invention can have random, alternating or block structures. The way in which copolymers having block structures can be obtained is, for example, comprehensively described in the unpublished patent application DE 10337077.3. The use of various structural elements enables properties such as solubility, solid state morphology, color, charge injection properties and charge transport properties, optoelectronic characteristics, etc., to be set.

Preference is given to polymers according to the invention which comprise at least one structural unit from groups (1) to (4) in addition to structural units of the formulae (1) and (2). Particular preference is given to at least one of these structural units having charge transport properties, i.e. the polymer comprising structural units from group (1) and/or (2). The proportion of these structural elements is preferably at least 1 mol %, particularly preferably at least 5 mol %, very particularly preferably at least 10 mol %. The maximum proportion of these structural elements is preferably not more than 80 mol %, particularly preferably not more than 40 mol %.

The polymers of the invention are prepared by polymerization of a plurality of monomers of which at least one forms repeater units of the formula (1) and one forms repeater units of the formula (2). A number of polymerization reactions which all lead to formation of C—C bonds have been found to be particularly useful here:

(A) polymerization by the SUZUKI method;
(B) polymerization by the YAMAMOTO method;
(C) polymerization by the STILLE method.

The way in which the polymerization according to these methods can be carried out and the way in which polymers can be separated off from the reaction medium and purified are described in detail in, for example, the unpublished patent application text WO 04/037887.

It can also be preferred to use the polymer of the invention not as a pure substance but rather as a mixture (blend) together with further polymeric, oligomeric, dendritic or low molecular weight substances. These can, for example, improve hole transport or electron transport or influence the charge equilibrium. Such blends are therefore also subject matter of the present invention.

The invention further provides solutions and formulations comprising one or more polymers or blends according to the invention in one or more solvents. The way in which polymer solutions can be prepared is described, for example in WO 02/072714, WO 03/019694 and the literature cited therein.

These solutions can be used to produce thin polymer layers, for example by means of surface coating methods (e.g. spin coating) or by means of printing methods (e.g. ink jet printing).

The polymers of the invention can be used in PLEDs. The way in which PLEDs can be produced is comprehensively described as a general process in WO 04/037887. This is to be adapted appropriately to the individual case.

As stated above, the polymers of the invention are very particularly useful as electroluminescence materials in PLEDs or displays produced in this way.

For the purposes of the invention, electroluminescence materials are materials which can be used as active layer in a PLED. "Active layer" means that the layer is capable of emitting light on application of an electric field (light-emitting layer) and/or that it improves the injection and/or transport of positive and/or negative charges (charge injection layer or charge transport layer).

The invention therefore also provides for the use of a polymer or blend according to the invention in a PLED, in particular as electroluminescence material. Here, the polymer of the invention or the blend preferably serves as emitting material.

The invention likewise provides a PLED having one or more active layers of which at least one comprises one or more polymers or blends according to the invention. The active layer can, for example, be a light-emitting layer and/or a charge transport layer and/or a charge injection layer.

The polymers of the invention have the following advantages:

(1) It has surprisingly been found that the polymers of the invention have significantly greater air stability than polymers according to the prior art. This applies particularly for green-emitting copolymers. This is of tremendous importance since the processing of the polymers and the process for producing PLEDs can be significantly simplified as a result. While the polymer films have hitherto had to be produced in an inert atmosphere to achieve optimal electroluminescence results, which means considerably increased technological difficulty, the polymer films comprising the polymers of the invention can be produced in air without the electroluminescence suffering as a result.

(2) In terms of the solubility behavior (e.g. gelling temperature at a given concentration, Viscosity at a given concentration), the polymers of the invention display significantly better properties than polymers comprising unsubstituted units of the formula (2). Thus, they have a better solubility in a wider range of solvents and do not have a tendency to gel. As a result, the polymers can be processed more easily and form more homogeneous films in the PLED. Processing by means of printing techniques, e.g. ink jet printing, is therefore also made possible. In addition, this makes it possible to copolymerize a higher proportion of these units into the polymer than is possible in the case of unsubstituted units.

(3) The operating voltage for the polymers of the invention is lower than for polymers according to the prior art. This results in a higher power efficiency.
(4) The voltage increase on prolonged operation is significantly lower than in the case of polymers according to the prior art.
(5) Furthermore, it has been found that, compared to the prior art, the green-emitting polymers of the invention have comparable or longer operative lives.
(6) A combination of units of the formulae (1) and (2) and possibly further units leads to polymers which emit green light (or red or white light depending on the comonomer) having very good color coordinates. Although this is not a direct advantage, since other polymers also have good color coordinates, it is a critical prerequisite for the use of these polymers. In particular, polymers according to the invention have better color coordinates in the green than do comparable polymers comprising unsubstituted units of the formula (2).

The present patent application text and also the examples below are directed at the use of polymers or blends according to the invention in PLEDs and the corresponding displays. Despite this restriction of the description, a person skilled in the art will be able to utilize the polymers or blends of the invention in other electronic devices, e.g. in organic field effect transistors (OFETs), in organic thin film transistors (OTFTs), in organic integrated circuits (O-ICs), in organic solar cells (O-SCs) or organic laser diodes (O-lasers), to name only a few applications, without having to make a further inventive step. The use of polymers according to the invention in the corresponding devices and also the devices themselves are likewise subject matter of the present invention.

EXAMPLES 1,4-Dibromo-2,5-difluorobenzene was obtained commercially from Lancaster; 1,4-dibromo-2,5-dimethoxybenzene and thiophene-2-boronic acid were obtained commercially from Aldrich. 1,4-Dibromo-2,5-bis(pentoxy)benzene (*Polymer* 1997, 38, 1221-1226), 1,4-dibromo-2,5-bis(isopentoxy) benzene (EP 1078970) and benzene-1,4-bis(boronic acid glycol ester) (*J. Org. Chem.* 1998, 63, 9535-9539) were synthesized by literature methods.

Example 1

Synthesis of 1,4-disubstituted 2,5-bis(2'-thienyl)benzene Derivatives

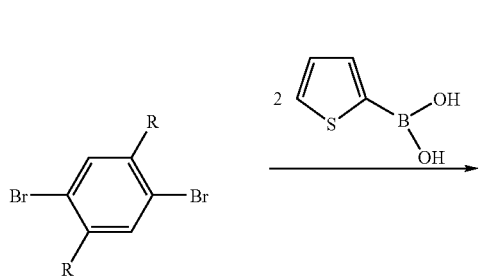

-continued

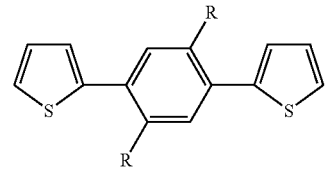

a) R = F
b) R = OMe
c) R = n-pentoxy
d) R = isopentoxy

General Method:

13.5 g (11.7 mmol, 0.065 eq.) of $Pd(PPh_3)_4$ were added to a nitrogen-saturated mixture of 180 mmol of the 2,5-disubstituted 1,4-dibromobenzene derivative, 60 g (469 mmol, 2.6 eq.) of thiophene-2-boronic acid, 149 g (702 mmol, 3.9 eq.) of $K_3PO_4$, 1 l of dioxane and 1 l of water and the suspension was heated at 80° C. for 7 hours. 0.8 g of NaCN was then added and the aqueous phase was separated off. The organic phase was washed twice with $H_2O$ and dried over $Na_2SO_4$.

a) 2,5-bis(2'-Thienyl)-1,4-difluorobenzene (R=F)

The crude product was recrystallized twice from toluene to give yellow crystals which according to HPLC had a purity of 99.8%. The yield was 44 g (88%).

$^1$H-NMR ($CDCl_3$, 500 MHz): [ppm]=8.14 (dd, $^2J$=3.6 Hz, 2H), 7.41 (m, 4H), 7.52 (d, $^2J$=3.6 Hz, 2H).

b) 2,5-bis(2'-Thienyl)-1,4-dimethoxybenzene (R=OMe)

The crude product was recrystallized twice from ethyl acetate to give yellow crystals which according to HPLC had a purity of 99.7%. The yield was 50 g (92%).

$^1$H-NMR ($CDCl_3$, 500 MHz): [ppm]=3.95 (s, 6H), 7.70 (dd, $^2J$=5.3 Hz, $^3J$=3.6 Hz, 2H), 7.25 (s, 2H), 7.35 (dd, $^2J$=5.3 Hz, $^3J$=1.0 Hz, 2H), 7.52 (dd, $^2J$=3.6 Hz, $^3J$=1.0 Hz, 2H).

c) 1,4-bis(n-Pentoxy)-2,5-bis(2'-thienyl)benzene (R=n-pentoxy)

The crude product was recrystallized twice from hexane to give yellow crystals which according to HPLC had a purity of 99.9%. The yield was 58 g (80%).

$^1$H-NMR ($CDCl_3$, 500 MHz): [ppm]=0.96 (t, $^2J$=7.3 Hz, 6H), 1.40 (m, 4H), 1.51 (m, 4H), 1.91 (m, 4H), 4.08 (t, $^2J$=6.7 Hz, 4H), 7.81 (dd, $^2J$=5.0 Hz, $^3J$=3.6 Hz, 2H), 7.26 (s, 2H), 7.36 (d, $^2J$=5.0 Hz, 2H), 7.53 (d, $^2J$=3.6 Hz, 2H).

d) 1,4-bis(Isopentoxy)-2,5-bis(2'-thienyl)benzene (R=isopentoxy)

The crude product was recrystallized twice from hexane to give yellow crystals which according to HPLC had a purity of 99.9%. The yield was 56 g (76%).

$^1$H-NMR ($CDCl_3$, 500 MHz): [ppm]=0.96 (d, $^2J$=6.6 Hz, 12H), 1.82 (m, 4H), 1.97 (m, 2H), 4.12 (t, $^2J$=5.3 Hz, 4H), 7.80 (dd, $^2J$=5.0 Hz, $^3J$=3.6 Hz, 2H), 7.26 (s, 2H), 7.35 (d, $^2J$=5.0 Hz, 2H), 7.52 (d, $^2J$=3.6 Hz, 2H).

Example 2

Synthesis of 1,4-disubstituted 2,5-bis(5'-bromo-2'-thienyl)benzene Derivatives (Monomers T1 to T4)

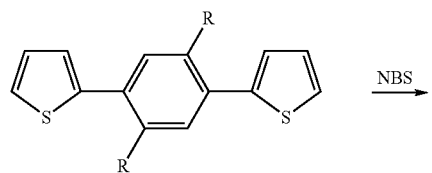

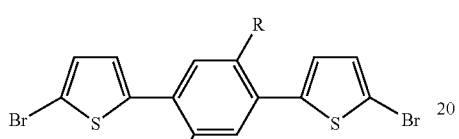

a) R = F
b) R = OMe
c) R = n-pentoxy
d) R = isopentoxy

General Method:

9.51 g (54 mmol) of N-bromosuccinimide were added at RT in a protective gas atmosphere and with exclusion of light to a solution of 26 mmol of the 1,4-disubstituted 2,5-bis(2'-thienyl)benzene derivative in 770 ml of chloroform over a period of 15 minutes. The mixture was stirred for 6 hours and 80 ml of saturated $Na_2CO_3$ solution were subsequently added, the organic phase was separated off and dried over $Na_2SO_4$. After removal of the solvent, the residue was recrystallized.

a) 2,5-bis(5'-Bromo-2'-thienyl)-1,4-difluorobenzene (R=F, Monomer T1)

The crude product was recrystallized twice from DMF to give yellow crystals which according to HPLC had a purity of 99.9%. The yield was 12 g (92%).

$^1$H-NMR (CDCl$_3$, 500 MHz): [ppm]=7.08 (d, $^2$J=3.6 Hz, 2H), 7.23 (d, $^2$J=3.6H, 2H), 7.35 (t, 9.0 Hz, 2H).

b) 2,5-bis(5'-Bromo-2'-thienyl)-1,4-dimethoxybenzene (R=OMe, Monomer T2)

The crude product was recrystallized twice from methanol to give yellow crystals which according to HPLC had a purity of 99.9%. The yield was 10 g (92%).

$^1$H-NMR (CDCl$_3$, 500 MHz): [ppm]=3.92 (s, 6H), 7.04 (d, $^2$J=4 Hz, 2H), 7.17 (s, 2H), 7.23 (d, $^2$J=4 Hz, 2H).

c) 2,5-bis(5'-Bromo-2'-thienyl)-1,4-bis(n-pentoxy)benzene (R=n-pentoxy, Monomer T3)

The crude product was recrystallized twice from acetone to give yellow crystals which according to HPLC had a purity of 99.8%. The yield was 12 g (94%).

$^1$H-NMR (CDCl$_3$, 500 MHz): [ppm]=0.96 (t, $^2$J=7.3 Hz, 6H), 141 (m, 4H), 1.51 (m, 4H), 1.91 (m, 4H), 4.08 (t, $^2$J=6.7 Hz, 4H), 7.03 (d, $^2$J=3.6 Hz, 2H), 7.15 (s, 2H), 7.24 (d, $^2$J=3.6 Hz, 2H).

d) 2,5-bis(5'-Bromo-2'-thienyl)-1,4-bis(isopentoxy)benzene (R=isopentoxy, Monomer T4)

The crude product was recrystallized twice from acetone to give yellow crystals which according to HPLC had a purity of 99.9%. The yield was 13 g (96%).

$^1$H-NMR (CDCl$_3$, 500 MHz): [ppm]=0.99 (d, $^2$J=6.6 Hz, 12H), 1.82 (m, 4H), 1.97 (m, 2H), 4.12 (t, $^2$J=5.3 Hz, 4H), 7.03 (d, $^2$J=3.6 Hz, 2H), 7.16 (s, 2H), 7.24 (d, $^2$J=3.6 Hz, 2H).

Example 3

Synthesis of 3-aryl-substituted Thiophene Derivatives

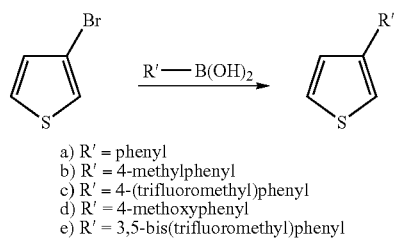

a) R' = phenyl
b) R' = 4-methylphenyl
c) R' = 4-(trifluoromethyl)phenyl
d) R' = 4-methoxyphenyl
e) R' = 3,5-bis(trifluoromethyl)phenyl The synthesis of 3-phenylthiophene and 3-(4'-methylphenyl)thiophene is described in *J. Org. Chem.* 2000, 65, 352-359. The synthesis of 3-(4'-methoxyphenyl)thiophene and 3-[4'-(trifluoromethyl)phenyl]thiophene is described in *J. Org. Chem.* 2002, 67, 457-469.

General Method:

1.3 g (1.16 mmol, 0.065 eq.) of Pd(PPh$_3$)$_4$ were added to a nitrogen-saturated mixture of 134 mmol of a benzene boronic acid derivative, 19.5 g (133 mmol) of 3-bromothiophene, 149 g (318 mmol) of Na$_2$CO$_3$, 300 ml of dioxane and 150 ml of water and the suspension was heated at 80° C. for 7 hours. 0.08 g of NaCN was then added and the aqueous phase was separated off. The organic phase was washed twice with H$_2$O and subsequently dried over Na$_2$SO$_4$.

3-[3',5'-bis(Trifluoromethyl)phenyl]thiophene

Removing the solvent and recrystallizing the residue twice from CH$_2$Cl$_2$/MeOH gave white needles which according to HPLC had a purity of 98.9%. The yield was 18 g (80%).

$^1$H-NMR (CDCl$_3$, 500 MHz): [ppm]=7.40 (dd, $^2$J=5.0 Hz, $^3$J=1.3 Hz, 1H), 7.47 (dd, $^2$J=5.0 Hz, $^3$J=3.0 Hz, 1H), 7.52 (dd, $^2$J=3.0 Hz, $^3$J=1.3 Hz, 1H) 7.78 (s, 1H), 7.79 (s, 2H).

Example 4

Synthesis of 3-aryl-Substituted 2-bromothiophene Derivatives

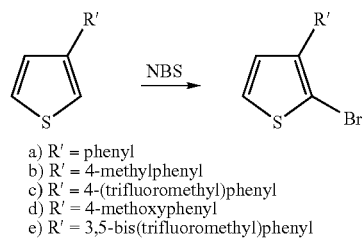

a) R' = phenyl
b) R' = 4-methylphenyl
c) R' = 4-(trifluoromethyl)phenyl
d) R' = 4-methoxyphenyl
e) R' = 3,5-bis(trifluoromethyl)phenyl The synthesis of 2-bromo-3-phenylthiophene and 2-bromo-3-(4'-methylphenyl)thiophene is described in *J. Org. Chem.* 2000, 65, 352-359. The synthesis of 2-bromo-3-(4'-methoxyphenyl)thiophene and 2-bromo-3-[4'-(trifluoromethyl)phenyl]thiophene is described in *J. Org. Chem.* 2002, 67, 457-469.

General Method:

11.3 g (64 mmol) of N-bromosuccinimide were added at RT under a protective gas atmosphere and with exclusion of light to a solution of 64 mmol of the 3-arylthiophene derivative in 250 ml of DMF over a period of 15 minutes. The mixture was stirred for 6 hours, 100 ml of saturated $Na_2CO_3$ solution were added, the organic phase was separated off and dried over $Na_2SO_4$.

2-Bromo-3-[3',5'-bis(trifluoromethyl)phenyl]thiophene

Removing the solvent and recrystallizing the residue twice from hexane gave white needles which according to HPLC had a purity of 98.7%. The yield was 14 g (87%).

$^1$H-NMR (CDCl$_3$, 500 MHz): [ppm]=7.08 (d, $^2$J=5.6 Hz, 1H), 7.39 (d, $^2$J=5.6 Hz, 1H) 7.87 (s, 1H), 8.01 (s, 2H).

Example 5

Synthesis of 3'-aryl-substituted 1,4-bis(2'-thienyl)benzene

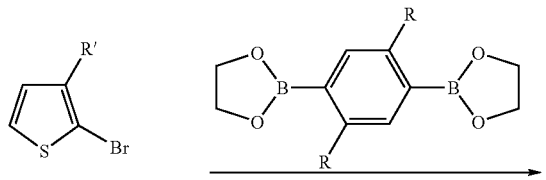

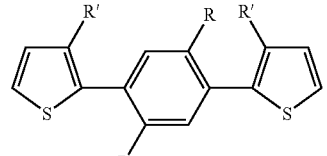

a) R' = phenyl, R = H
b) R' = 4-methylphenyl, R = H
c) R' = 4-(trifluoromethyl)phenyl, R= H
d) R' = 4-methoxyphenyl, R = H
e) R' = 3,5-bis(trifluoromethyl)phenyl, R = H General Method:

1.34 g (1.16 mmol) of Pd(PPh$_3$)$_4$ were added to a nitrogen-saturated mixture of 21.1 g (67 mmol) of benzene-1,4-bis(boronic acid glycol ester), 133 mmol of the 2-bromo-3-arylthiophene derivative, 33.6 g (318 mmol) of Na$_2$CO$_3$, 300 ml of dioxane and 150 ml of water and the suspension was heated at 80° C. for 7 hours. 0.08 g of NaCN was then added and the aqueous phase was separated off. The organic phase was washed twice with H$_2$O and subsequently dried over Na$_2$SO$_4$.

1,4-bis(3'-Phenyl-2'-thienyl)benzene

Removing the solvent and recrystallizing the residue twice from hexane gave yellow needles which according to HPLC had a purity of 97.9%. The yield was 22 g (85%).

$^1$H-NMR (CDCl$_3$, 500 MHz): [ppm]=7.13 (d, $^2$J=5.3 Hz, 2H), 7.19 (s, 4H), 7.23 (t, $^2$J=2.6 Hz, 2H), 7.28 (m, 8H), 7.31 (d, $^2$J=5.3 Hz, 2H).

Example 6

Synthesis of 3'-aryl-substituted 1,4-bis(5'-bromo-2'thienyl)benzene

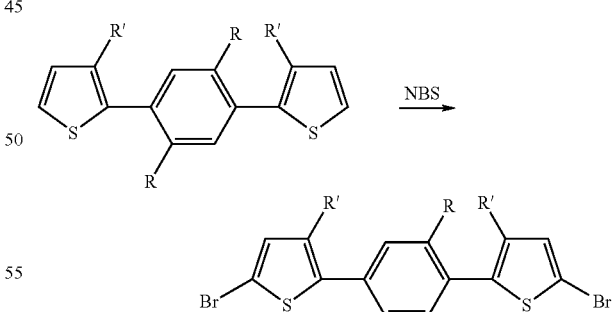

a) R' = phenyl, R = H
b) R' = 4-methylphenyl, R = H
c) R' = 4-(trifluoromethyl)phenyl, R= H
d) R' = 4-methoxyphenyl, R = H
e) R' = 3,5-bis(trifluoromethyl)phenyl, R = H The bromination of the compounds from Example 5 was carried out in a manner analogous to the bromination method of Example 2.

1,4-bis(5'-Bromo-3'-phenyl-2'-thienyl)benzene
(Monomer T5)

Recrystallizing the residue twice from methanol gave yellow crystals which according to HPLC had a purity of 99.9%. The yield was 10 g (92%).

$^1$H-NMR (CDCl$_3$, 500 MHz): [ppm]=7.15 (s, 2H), 7.20 (s, 4H), 7.23 (t, $^2$J=2.6 Hz, 2H), 7.28 (m, 8H).

Example 6

Synthesis of Further Comonomers

The structures of the monomers of the formula (1) and further comonomers for polymers according to the invention and comparative polymers are depicted below. The synthesis of these compounds is described in WO 03/020790.

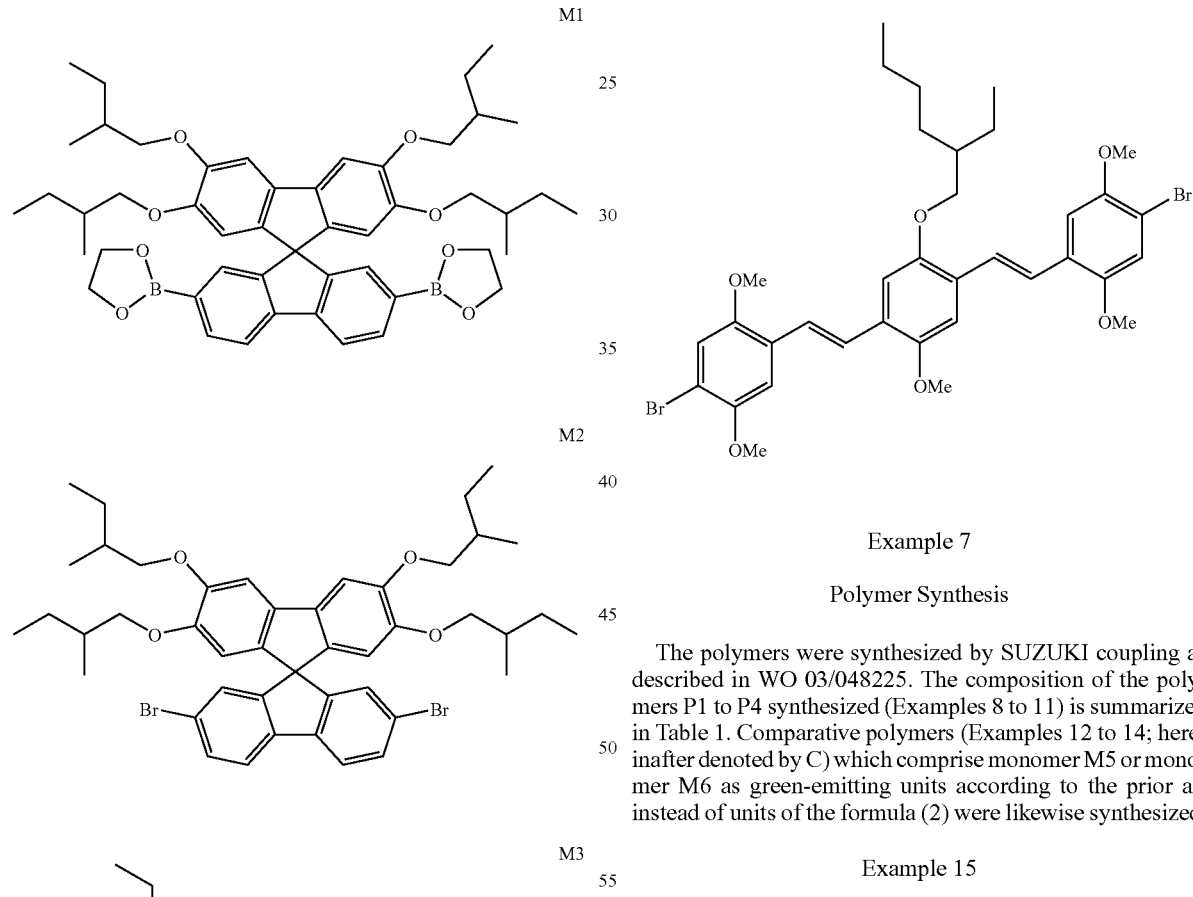

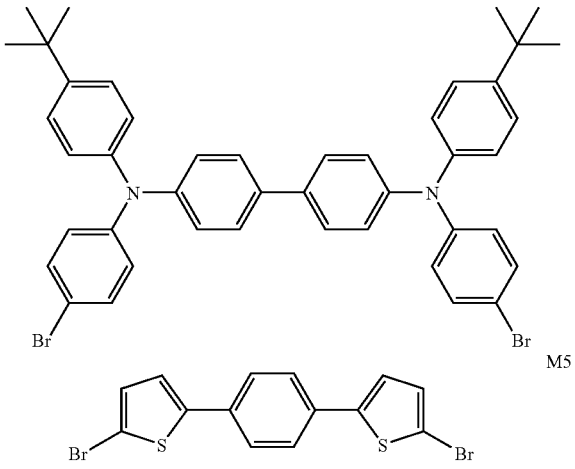

Example 7

Polymer Synthesis

The polymers were synthesized by SUZUKI coupling as described in WO 03/048225. The composition of the polymers P1 to P4 synthesized (Examples 8 to 11) is summarized in Table 1. Comparative polymers (Examples 12 to 14; hereinafter denoted by C) which comprise monomer M5 or monomer M6 as green-emitting units according to the prior art instead of units of the formula (2) were likewise synthesized.

Example 15

Production of PLEDs

All polymers were examined for use in PLEDs. These PLEDs were in each case two-layer systems, i.e. substrate// ITO//PEDOT//polymer//cathode. PEDOT is a polythiophene derivative (Baytron P from H. C. Starck, Goslar). Ba/Ag (from Aldrich) was used as cathode in all cases. The way in which PLEDs can be produced is comprehensively described in WO 04/037887 and the literature cited therein.

The most important device properties of the polymers according to the invention (color, efficiency, operating voltage, life) are shown in Table 1 and are compared to the comparative polymers which do not contain any units of the formula (2).

lar weight are compared in solutions of the same concentration. The viscosity of the comparative polymer is clearly too high; this polymer is therefore not suitable for problem-free

TABLE 1

Properties of polymers according to the invention and comparison of these with polymers according to the prior art; all polymers were prepared by means of the Suzuki polymerization.

| Ex. | Polymer No. | Monomer of the formula (2) | \multicolumn{6}{c}{Proportion of monomers in the polymerization in %} | \multicolumn{2}{c}{GPC*} | \multicolumn{5}{c}{Electroluminescence} |
|---|---|---|---|---|---|---|---|---|---|---|---|---|---|---|---|
| | | | M1 | M2 | M3 | M4 | M5 | M6 | $M_w$ (·1000 g/mol) | $M_n$ (·1000 g/mol) | $\lambda_{max}$ [nm] | Max. Eff. [cd/A] | U at 100 cd/m² [V] | CIE x/y | Life at 100 cd/m² [h] |
| \multicolumn{16}{c}{Polymers according to the invention comprising units of the formula (1) and (2)} |
| 8 | P1 | 30 T3 | 50 | — | 10 | 10 | — | — | 593 | 89 | 512/541 | 9.9 | 2.7 | 0.34/0.59 | >6000 |
| 9 | P2 | 30 T2 | 50 | — | 10 | 10 | — | — | 130 | 48 | 540 | 9.9 | 2.7 | 0.35/0.58 | >6000 |
| 10 | P3 | 30 T1 | 50 | — | 10 | 10 | — | — | 378 | 120 | 539 | 9.7 | 2.6 | 0.35/0.57 | >6000 |
| 11 | P4 | 30 T5 | 50 | — | 10 | 10 | — | — | 152 | 57 | 493/523 | 10.1 | 2.6 | 0.25/0.52 | >7000 |
| \multicolumn{16}{c}{Comparative polymers containing no units of the formula (2)} |
| 12 | C1 | — | 50 | — | 20 | 10 | — | 20 | 497 | 140 | 505/535 | 9.8 | 3.3 | 0.29/0.57 | >5000 |
| 13 | C2 | — | 50 | — | 20 | 10 | 20 | — | 577 | 96 | 492/524 | 9.7 | 3.2 | 0.25/0.53 | 4500 |
| 14 | C3 | — | 50 | — | 10 | 10 | 30 | — | 253 | 54 | 493/525 | 8.4 | 2.7 | 0.27/0.56 | 4700 |

*GPC measurements: THF; 1 ml/min, Plgel 10 μm Mixed-B 2 × 300 × 7.5 mm², 35° C., RI detection was calibrated against polystyrene.

Example 16

Comparison of the Viscosity of the Polymer Solutions

The viscosity of some solutions of polymers having substituted and unsubstituted dithienylarylene units was examined. The results are shown in Table 2.

TABLE 2

Viscosities of solutions of polymers according to the invention and comparative polymers in o-xylene at various temperatures

| Polymer | $M_w$ (·1000 g/mol) | Conc. [g/l] | η [mPa·s] 10° C. | η [mPa·s] 20° C. | η [mPa·s] 30° C. |
|---|---|---|---|---|---|
| P1 | 593 | 10 | 5.16 | 4.46 | 3.92 |
| P3 | 378 | 10 | 41.20 | 18.21 | 9.86 |
| C3 | 253 | 8 | 3753 | 422 | 63 |

It can clearly be seen that the polymers according to the invention have a much lower viscosity than polymers according to the prior art which comprise unsubstituted dithienylarylene units. This is especially significant since the polymers P1 and P3 examined here have a (sometimes considerably) higher molecular weight than the comparative polymer C3 and the viscosity increases with the molecular weight. In addition, the concentration of the comparative polymer was lower than that of the polymers according to the invention, and the viscosity of a polymer solution increases with increasing concentration. When these aspects are additionally taken into account, it can be concluded that the effect is even more pronounced when polymers of the same molecular weight are compared in solutions of the same concentration. The viscosity of the comparative polymer is clearly too high; this polymer is therefore not suitable for problem-free production of PLEDs, in particular by ink jet printing for which a suitable solution viscosity of from about 4 to 25 mPa·s is indicated.

Example 17

Comparison of the Air Stability of the Polymers

PLEDs were produced using polymer P1 and comparative polymer C1, firstly in a nitrogen atmosphere and secondly in air, and the electroluminescence of the devices obtained in this way was examined. The results are summarized in Table 3.

TABLE 3

Comparison of the efficiency of PLEDs produced under nitrogen or in air.

| Polymer | Production | Max. Eff. [cd/A] |
|---|---|---|
| P1 | $N_2$ | 9.9 |
| P1 | Air | 9.6 |
| C1 | $N_2$ | 9.8 |
| C1 | Air | 0.77 |

As can clearly be seen from these data, the polymer according to the invention can be processed without problems in air without a significant deterioration in the electroluminescence properties, while the comparative polymer C1 according to the prior art displays a maximum efficiency which is reduced by more than an order of magnitude under the same production conditions. It is thus clear that the polymers according to the invention are suitable for simplifying the production process of PLEDs by production under inert conditions being unnecessary.

Example 18

Voltage and Voltage Increase During Operation

PLEDs were produced using polymer P1 and comparative polymer C1, and the operating voltage was monitored during operation of the devices at a constant current density of 10 mA/cm$^2$. The change in the operating voltage over time is shown in FIG. 1.

As can clearly be seen from the figure, the voltage required for a current density of 10 mA/cm$^2$ is significantly lower for the polymer P1 according to the invention than for the comparative polymer C1. Furthermore, it can be seen from the figure that the voltage increase is significantly lower and even close to zero in the case of the polymer according to the invention, while the increase for the comparative polymer is significantly higher. This is an important result since it shows that the polymer according to the invention is more stable toward electric current than is the comparative polymer.

The invention claimed is:

1. A polymer comprising at least 5 mol % of units of the formula (1),

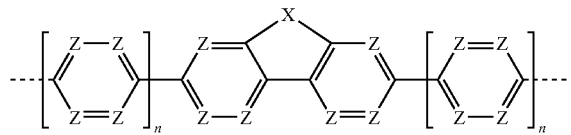

Formula (1)

where the symbols used have the following meanings:
X is identical or different on each occurrence and is in each case CR$_2$, N(R$^1$), —CR$_2$—CR$_2$— or —N(R$^1$)—CR$_2$—;
Z is identical or different on each occurrence and is in each case CR or N;
R is identical or different on each occurrence and is in each case H, a linear, branched or cyclic alkyl or alkoxy chain which has from 1 to 22 carbon atoms and in which one or more nonadjacent carbon atoms may also be replaced by N(R$^1$)—, —O—, —S—, —O—CO—O—, —CO—O—, C=O, —C(R$^1$)=C(R$^1$)— or —C≡C—, where one or more H atoms may also be replaced by fluorine or an aromatic radical R$^1$, an aromatic or heteroaromatic ring system or an aryloxy group having from 5 to 40 carbon atoms, in which one or more carbon atoms may also be replaced by O, S or N and which may also be substituted by one or more nonaromatic radicals R, where two or more of the radicals R may together also form an aromatic or aliphatic, monocyclic or polycyclic ring system, or fluorine, chlorine, CN, N(R$^1$)$_2$, Si(R$^1$)$_3$ or B(R$^1$)$_2$;
R$^1$ is identical or different on each occurrence and is in each case H, a linear, branched or cyclic alkyl chain which has from 1 to 22 carbon atoms and in which one or more nonadjacent carbon atoms may also be replaced by O, S, —CO—O—, —O—CO—O—, C=O, —CH=CH— or —C≡C—, where one or more H atoms may also be replaced by fluorine, an aryl, heteroaryl or aryloxy group which has from 5 to 40 carbon atoms and in which one or more carbon atoms may also be replaced by O, S or N, which may also be substituted by one or more nonaromatic radicals R$^1$, where one or more radicals R$^1$ or R$^1$ and further radicals R may together also form an aromatic or aliphatic, monocyclic or polycyclic ring system;
n is identical or different on each occurrence and is in each case 0 or 1;
characterized in that the polymer further comprises at least 0.01 mol %, of units of the formula (2),

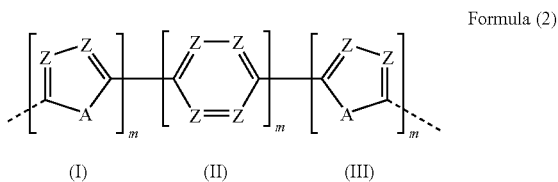

Formula (2)

where the symbols and indices have the following meanings:
A is identical or different on each occurrence and is in each case S, O or N(R$^1$);
Z is identical or different on each occurrence and is in each case CR* or N, with the proviso that the central unit (II) is not a quinoxaline, not a benzothiadiazole and not an unsubstituted anthracene and with the further proviso that at least one radical R* is not hydrogen;
R* is identical or different on each occurrence and is in each case H, a linear, branched or cyclic alkyl or alkoxy chain which has from 1 to 22 carbon atoms and in which one or more nonadjacent carbon atoms may also be replaced by N(R$^1$)—, —O—, —S—, —O—CO—O—, —CO—O—, C=O, —C(R$^1$)=C(R$^1$)— or —C≡C—, where one or more H atoms may also be replaced by fluorine or an aromatic radical R$^1$, an aromatic or heteroaromatic ring system or an aryloxy group having from 5 to 40 carbon atoms, in which one or more carbon atoms may also be replaced by O, S or N and which may also be substituted by one or more nonaromatic radicals R*, where two or more of the radicals R* may together also form an aliphatic, monocyclic or polycyclic ring system, or fluorine, chlorine, CN, N(R$^1$)$_2$, Si(R$^1$)$_3$ or B(R$^1$)$_2$;
m is identical or different on each occurrence and is in each case 1, 2 or 3;
the further symbols are as described under the formula (1);
and the broken-line bond in formula (1) and formula (2) as in all further formulae indicates the linkage in the polymer.

2. The polymer as claimed in claim 1, characterized in that it is conjugated.

3. The polymer as claimed in claim 1, characterized in that it additionally comprises further structural elements.

4. The polymer as claimed in claim 3, characterized in that the further structural elements improve the hole injection properties and/or hole transport properties of the polymer.

5. The polymer as claimed in claim 4, characterized in that the structural elements are selected from the classes of triarylamine derivatives, benzidine derivatives, tetraarylene-paraphenylenediamine derivatives, phenothiazine derivatives, phenoxazine derivatives, dihydrophenazine derivatives, thianthrene derivatives, dibenzo-p-dioxin derivatives, phenoxathiin derivatives, carbazole derivatives, azulene derivatives, thiophene derivatives, pyrrole derivatives and furan derivatives.

6. The polymer as claimed in claim 1, characterized in that the further structural elements improve the electron injection properties and/or electron transport properties of the polymer.

7. The polymer as claimed in claim 6, characterized in that the structural elements are selected from the classes of pyridine derivatives, pyrimidine derivatives, pyridazine derivatives, pyrazine derivatives, triazine derivatives, anthracene derivatives, oxadiazole derivatives, benzothiadiazole derivatives, quinoline derivatives, quinoxaline derivatives, phenazine derivatives and triarylboranes.

8. The polymer as claimed in claim 4, characterized in that the further structural elements comprise combinations of individual units as claimed in claim 4.

9. The polymer as claimed in claim 1, characterized in that the further structural elements influence the morphology or possibly also the emission color of the polymers.

10. The polymer as claimed in claim 9, characterized in that these structural elements are selected from the classes of 1,4-phenylene derivatives, 1,4-naphthylene derivatives, 1,4-anthrylene derivatives, 9,10-anthrylene derivatives, 1,6-pyrenylene derivatives, 2,7-pyrenylene derivatives, 4,9-pyrenylene derivatives, 3,9-perylenylene derivatives, 3,10-perylenylene derivatives, 2,7-phenanthrenylene derivatives, 3,6-phenanthrenylene derivatives, 4,4'-biphenylylene derivatives, 4,4"-terphenylylene derivatives, 4,4'-bi-1,1'-naphthylylene derivatives, 5,7-dihydrodibenzooxepinylene derivatives, 4,4'-stilbenzylene derivatives and 4,4"-bisstyrylarylene derivatives.

11. The polymer as claimed in claim 1, characterized in that at least one further structural element which has charge transport properties is present.

12. The polymer as claimed in claim 1, characterized in that in structural units of the formula (1), Z=CR.

13. The polymer as claimed in claim 12, characterized in that the structural units of the formula (1) are selected from among the group consisting of fluorenes of the formula (3), 9,9'-spirobifluorenes of the formula (4) which may be substituted by a $C_1$-$C_{40}$ organic radical or be unsubstituted, dihydrophenanthrenes of the formula (5), trans-indenofluorenes of the formula (6) and cis-indenofluorenes of the formula (7), Formula (3):

fluorene

Formula (4):

Spiro-9,9'-bifluorene

Formula (5):

9,10-dihydrophenanthrene

Formula (6):

trans-indenofluorene

Formula (7):

cis-indenofluorene wherein

R is identical or different on each occurrence and is in each case H, a linear, branched or cyclic alkyl or alkoxy chain which has from 1 to 22 carbon atoms and in which one or more nonadjacent carbon atoms may also be replaced by $N(R^1)$—, —O—, —S—, —O—CO—O—, —CO—O—, C=O, —C($R^1$)=C($R^1$)— or —C≡C—, where one or more H atoms may also be replaced by fluorine or an aromatic radical $R^1$, an aromatic or heteroaromatic ring system or an aryloxy group having from 5 to 40 carbon atoms, in which one or more carbon atoms may also be replaced by O, S or N and which may also be substituted by one or more nonaromatic radicals R, where two or more of the radicals R may together also form an aromatic or aliphatic, monocyclic or polycyclic ring system, or fluorine, chlorine, CN, $N(R^1)_2$, $Si(R^1)_3$ or $B(R^1)_2$;

$R^1$ is identical or different on each occurrence and is in each case H, a linear, branched or cyclic alkyl chain which has from 1 to 22 carbon atoms and in which one or more nonadjacent carbon atoms may also be replaced by O, S, —CO—O—, —O—CO—O—, C=O, —CH=CH— or —C≡C—, where one or more H atoms may also be replaced by fluorine, an aryl, heteroaryl or aryloxy group which has from 5 to 40 carbon atoms and in which one or more carbon atoms may also be replaced by O, S or N, which may also be substituted by one or more nonaromatic radicals $R^1$, where one or more radicals $R^1$ or $R^1$ and further radicals R may together also form an aromatic or aliphatic, monocyclic or polycyclic ring system.

14. The polymer as claimed in claim 1, characterized in that in units of the formula (2):

Z is identical or different on each occurrence and is in each case CR, with the restrictions mentioned in claim 1 continuing to apply;

A is identical or different on each occurrence and is in each case O or S;

m is identical or different on each occurrence and is in each case 1 or 2;

the further symbols are as defined under claim 1.

15. The polymer as claimed in claim 14, characterized in that in units of the formula (2):

Z is identical or different on each occurrence and is in each case CR, with the restrictions mentioned in claim 1 continuing to apply and at least two radicals R being different from hydrogen;

A is S on each occurrence;

R is as defined under claim 1;

$R^1$ is as defined under claim 1;

m is 1 on each occurrence.

16. The polymer as claimed in claim 1, characterized in that the proportion of structural units of the formula (1) is at least 10 mol % and the proportion of structural units of the formula (2) is at least 5 mol %.

17. A blend of at least one polymer as claimed in claim 1 with further polymeric, oligomeric, dendritic or low molecular weight substances.

18. Solutions and formulations comprising one or more polymers or blends as claimed in claim 1 in one or more solvents.

19. A polymeric light-emitting diode(PLED) PLED having one or more active layers of which at least one comprises one or more polymers or blends as claimed in claim 1.

20. An organic field effect transistor (OFET), organic thin film transistor (OTFT), organic integrated circuit (O-IC), organic solar cell (O-SC) or organic laser diode (O-laser) comprising one or more polymers or blends as claimed in claim 1.

* * * * *